United States Patent [19]

Cho et al.

[11] Patent Number: 4,830,886

[45] Date of Patent: May 16, 1989

[54] PROCESS FOR MAKING CUTTING INSERT WITH TITANIUM CARBIDE COATING

[75] Inventors: Toshiaki Cho, Hindsdale, Ill.; Krishnan Narasimhan, Southfield; Deepak G. Bhat, Troy, both of Mich.

[73] Assignee: GTE Valenite Corporation, Troy, Mich.

[21] Appl. No.: 164,768

[22] Filed: Mar. 7, 1988

[51] Int. Cl.$^4$ ............................................. C23C 16/32
[52] U.S. Cl. ................................. 427/249; 427/255; 427/255.2; 427/343
[58] Field of Search ............... 427/249, 255.2, 255, 427/343, 377

[56] References Cited

U.S. PATENT DOCUMENTS

| | | | |
|---|---|---|---|
| 2,962,388 | 11/1960 | Ruppert et al. | 117/49 |
| 3,640,689 | 2/1972 | Glaski et al. | 29/195 |
| 3,642,522 | 2/1972 | Gass et al. | 117/106 |
| 3,832,221 | 8/1974 | Ekemar | 117/106 |
| 4,018,631 | 4/1977 | Hale | 148/31.5 |
| 4,035,541 | 7/1977 | Smith et al. | 428/217 |
| 4,150,195 | 4/1979 | Tobioka et al. | 428/548 |
| 4,282,289 | 8/1981 | Kullander et al. | 428/457 |
| 4,399,168 | 8/1983 | Kullander et al. | 427/255.7 |
| 4,497,874 | 2/1985 | Hale | 428/551 |

OTHER PUBLICATIONS

Sarin, "TEM Studies of Wear Resistant TiC Coatings", *Chemical Vapor Deposition*, pp. 476–487, 1979.
"Development of the ACE COAT Series", T. Yamamoto et al.
"The Role of Interface Development During CVD . . . ", D. G. Bhat et al.
"Relationship Between Metal Cutting . . . ", T. Cho et al.

*Primary Examiner*—Sadie Childs
*Attorney, Agent, or Firm*—Robert E. Walter

[57] ABSTRACT

In a process for preparing a coated cemented carbide cutting insert, a layer of titanium carbide containing eta phase is first vapor deposited directly adjacent a cobalt cemented tungsten carbide substrate and the eta phase is then removed by contacting the titanium carbide surface with a carburizing gas under suitable conditions to convert the eta phase to elemental cobalt and tungsten carbide.

7 Claims, No Drawings

PROCESS FOR MAKING CUTTING INSERT WITH TITANIUM CARBIDE COATING

BACKGROUND OF INVENTION

The present invention relates to cemented carbide cutting tools having an adherent coatings of titanium carbide and process for deposition of those coatings.

PRIOR ART

Cemented carbide cutting tools are widely used in metal cutting applications owing to their unique properties of high hardness, toughness, strength, and wear resistance. It is known that the wear resistance of cemented carbide materials can be further improved by applying a thin layer of a coating of a refractory compound such as titanium carbide, titanium nitride, aluminum oxide, and combinations thereof. Such coatings have widened the application range of cemented carbide tools.

Advances in metal working equipment manufacture and economic necessities of higher productivity have combined to put greater demands of improved performance on the cutting tool materials. As set forth in a publication by the American Society for Metals an article entitled, "Relationship Between Metal Cutting Performance and Material Properties of TiC Coated Cemented Carbide Cutting Tools" by Toshiaki Cho, Deepak G. Bhat, and Paul F. Woerner ('85 ASM's International Conference on Surface Modifications and Coatings, Toronto, Ontario, Canada, 14–16 Oct. 1985), TiC remains a popular coating for cutting tools for many reasons. TiC has a higher hardness compared with other materials such as TiN, $Al_2O_3$, and HfN. When used as an interlayer, TiC can improve adhesion between an $Al_2O_3$ coating and the cemented carbide substrate.

Tungsten carbide based sintered alloys are used as substrate material for the coated cutting tools because of the high mechanical strength, hardness and good wear resistance. As a substrate material, the tungsten carbide based alloy has higher toughness than other materials such as titanium carbide based sintered alloys, titanium nitride based sintered alloys and alumina-based ceramics. However, when the tungsten carbide based substrates are coated with titanium carbide by chemical vapor deposition techniques, a brittle layer of a complex carbide, known as the eta phase, tends to form around the tungsten carbide grains. The brittle layer acts as a site initiating the propagate of cracks so that the cutting inserts with this deleterious complex exhibit a marked reduction in strength.

The deleterious effect of eta phase is described in the papers by Bhat, Cho and Woerner (Relationship between metal-cutting performance and material properties of TiC-coated cemented carbide cutting tools, Surface and Coatings Technology, Vol. 29, 1986, pp. 239–246; the role of interface development during chemical vapor deposition in the performance of TiC-coated cemented carbide cutting tools, Journal of Vacuum Science and Technology, Vol. A4(6), 1986, pp. 2713–2716.)

Another problem encountered during vapor phase deposition is the diffusion of cobalt to the surface and into the TiC coating. One technique to avoid these problems is not to use titanium carbide. Several practitioners of the art resort to depositing a film of TiN on the surface first.

SUMMARY

The present invention relates to a process for forming a titanium carbide layer on the cemented carbide substrate without the presence of a deleterious eta phase. It is an object of the present invention to eliminate or reduce the presence of the eta phase from the coating/substrate interface region. It is a further object to achieve the above without sacrificing the advantageous properties of a TiC titanium carbide coating for metal-cutting applications. Further, it is an object to enhance one or some of the desirable properties, such as the adhesion of the coating. Hence, the present invention is directed to an improved process for obtaining a coated substrate which obviates one or more disadvantages of prior processes.

In accordance with the present invention, there is provided process for making a cemented carbide cutting insert of the type comprising a substrate of tungsten carbide grains in a cobalt matrix having a layer of titanium carbide directly adjacent said substrate. The substrate directly adjacent said coating comprises tungsten carbide in a form chemically unreacted with cobalt. More particularly, the substrate directly adjacent the coating is characterized by the absence of eta phase.

In accordance with the process of the present invention, the undesirable eta phase formed during the vapor phase deposition of titanium carbide, or during the manufacture of the substrate is removed by carburizing the surface of the coated insert with a carburizing gas in the presence of hydrogen at a sufficiently high temperature to form cobalt and tungsten carbide constituents from said eta phase.

DETAILED DESCRIPTION

The cemented metal carbide substrate consists essentially of metal carbide particles in an amount from about 70 to about 97 percent by weight dispersed throughout a matrix of binder material which is present in an amount from about 3 to 30 percent by weight. Typical metal carbides are carbides of tungsten, molybdenum, chromium, columbium, tantalum, titanium, zirconium, vanadium, and hafnium. In the tungsten carbide based cement cutting inserts of the present invention, the hard refractory metal carbide employed comprises as least a major portion by weight tungsten carbide. Preferably, tungsten carbide is employed in an amount greater than 70%, more preferably greater than about 90% by weight of the metal refractory carbide. Due to excellent wettability with binders, tungsten carbide is preferably used in its hexagonal form. The most common additional carbides are those of titanium and tantalum with some specialized use made of the carbides of columbium, molybdenum, vanadium, chromium, zirconium and hafnium. A principle purpose of additional carbides is to reduce the mean grain size of the tungsten carbide grains. The additional carbides tend to dissolve is cobalt binder and impede the growth tungsten carbide grains during sintering. Preferably the starting powder of grains of metal carbide used have a mesh size of less than 200 mesh, U.S. standard screen size. This results in particle sizes less than approximately 10 microns.

The matrix binder material employed for the substrate are preferably the iron group metals comprising cobalt, nickel, and iron, most preferably cobalt. Cobalt is preferred for use with tungsten carbide based alloys of the present invention due to excellent wettability. Cobalt preferably comprises greater than about 70% by weight of the binder or matrix material and preferably more than 90% by weight. Other materials may be alloyed with the cobalt matrix binder material provided the desirable final properties are not unduly affected. In addition to nickel and iron mentioned above, additional ingredients include molybdenum, tungsten or other metals. The other components of the matrix should not unduly influence the desirable high strength properties of the insert preferably have a transverse rupture strength in excess of 200,000 psi.

The apparatus used in the process of the present invention comprises an enclosed vessel of stainless steel or other suitable material having a removable top or bottom cover. The cover is attached to the reaction vessel by any suitable means such as bolts, clamps, hinges, or other means. The vessel is provided with an inlet and an outlet whereby the inlet gaseous mixture flows through a reaction zone containing the substrate to be coated and exits through an outlet. Typically the vesel includes a premix chamber where the gases utilized are premixed at a temperature lower than the reaction temperature. Uniformly mixed gases exiting the premix chamber flow into the inlet to the reaction zone.

The cemented carbide substrates or inserts are positioned in the reaction zone by conventional means such as a rotatable table, trays, hooks, hangers, or other fixture known in the art. The vessel includes heating elements typically in the form of graphite heating rods. The reaction vessel is loaded with the inserts to be coated and typically flushed with a suitable inert gas such as nitrogen, argon, or the like prior to the introduction of the gaseous reactants.

The layer of titanium carbide is chemically vapor deposited on the inserts from a flowing mixture consisting essentially of gaseous reactants and inert gas. The deposition reaction is continued until the thickness of TiC is at least approximately 2 microns and, more preferably, at least approximately 4 microns. The reaction proceeds according to the following formula:

$$TiCl_4 + CH_4 = TiC + 4HCl$$

The reaction mechanism in the chemical vapor deposition of a TiC coating may be expressed in a stepwise sequence according to the following equations:

$$TiCl_4 + \tfrac{1}{2}H_2 = TiCl_3 + HCl$$

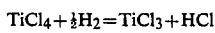

$$TiCl_4 + H_2 = TiCl_2 + 2HCl$$

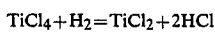

$$TiCl_{(4-x)} + CH_4 = TiC + (4-x)HCl + x/2 H_2$$

Carbon contained in the substrate may be an additional source of carbon. The reaction of TiC with the substrate can be represented by the following equations:

$$2TiCl_4 + 3WC + 3Co + 4H_2 = 2TiC + Co_3W_3C + 8HCl$$

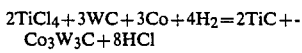

$$2TiCl_3 + 3WC + 3Co + 3H_2 = 2TiC + Co_3W_3C + 6HCl$$

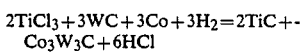

$$5TiCl_3 + 6WC + 6Co + 15/2 H_2 = 5TiC + Co_6W_6C + 15HCl$$

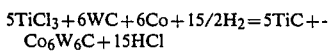

The reaction products containing cobalt are eta phase substances which cause embrittlement at the coating/substrate interface.

The reactant gases are passed over the inserts in the reaction zone. The temperature of the reaction zone and of the substrate surface as well as the total flow and composition of the gas phase over the substrate are so selected as to allow the reaction between the gas and the substrate surface to proceed according to the thermodynamic principles. The total flow conditions and the total gas pressure are so selected as to allow the products of the reaction to be removed continuously from the reaction zone.

The fine grain size of the coating of the present invention has a porosity-free structure as observed through an optical microscope. The fine grain size of the present invention is preferably less than approximately 1 micron. In the present invention fine-grained coated inserts showed better wear resistance than those having a relatively coarse grain size. The improvements in wear resistance appear to reach a maximum at approximately 0.3 micron grain size.

It is known that the decarburization of a cemented carbide substrate results in the occurrence of brittle zones of eta phase at the coating/substrate interface. The eta phase is a ternary compound of cobalt, tungsten, and carbon, with a composition of the type $Co_x W_y C$ where $x+y=6$ and/or 12, and x and y have values in the range of 2 to 6.

According to some reports in the literature, this phase is considered to be advantageous in cemented carbide because of alleged improvements in adhesion and wear resistance of the coating. In the present invention it is desirable to remove the eta phase due to its inherent brittle nature and the internal stresses and porosity caused when this compound is formed. The eta phase can cause cracks and shrinkage porosity which can result in premature failure of the insert under cutting conditions. In accordance with the principles of the present invention, the substrate directly adjacent the layer of titanium carbide comprises tungsten carbide in a form chemically unreacted with cobalt.

According to the carburizing process, the titanium carbide coated substrate is contacted with a hydrocarbon carburizing gas under suitable conditions to dissociate the gas, diffuse carbon formed during the disassociation through the coating and into the substrate, and react the carbon with eta phase present in the substrate to form tungsten carbide and cobalt. In addition, the carburizing gas reacts with eta phase to form elemental tungsten which diffuses into the TiC coating to form a (W,Ti)C solid solution interlayer. Preferably, the carburizing process is carried out under suitable conditions so that substantially all of the eta phase present in the substrate directly adjacent the coating is decomposed.

The hydrocarbon component of the gas typically has a chemical formula $C_n H_{2n+2}$ where n is from 1 to 4. The preferred carburizing gas is methane. The concentration of carburizing gas is preferably maintained sufficiently high to permit carbon to be available to diffuse through the coating to react with the eta phase while sufficiently low to reduce the tendency for free carbon to deposit on the surface. The carburizing gas may be a mixture of ingredients with inert or gaseous reducing components mixed with the hydrocarbon component. Preferably, the noncarburizing component comprises hydrogen. When hydrogen is used as a diluent, the concentration of the hydrocarbon component is preferably from about 0.1 to abut 2.0 volume percent. The most preferred concentration is from about 0.2 to 1 percent. The additional ingredients may aid in pyrolysis of the hydrocarbon component and act to dilute and uniformly distribute the carbon flux in the furnace.

Preferably, the carburizing process is carried out so that tungsten from the substrate diffuses into the titanium carbide coating to form an interfacial region consisting of tungsten, titanium and carbon. The interface forms a portion of the coating directly adjacent the substrate. It is believed that the formation of the interface permits the coating to be more strongly bonded to the substrate. The thickness of this interface can be controlled by the carburizing process parameters. Typically, the thickness of the interface is from about 0.5 to about 6 microns. Preferably, the thickness of the interface is from about 0.8 to about 4 microns, with the most preferred range being about 1 to about 3 microns.

The temperature during the carburizing process is preferably sufficiently high to pyrolyze the hydrocarbon component and diffuse carbon through the coating into the substrate. The temperature is selected to promote the diffusion of tungsten but inhibit diffusion of deleterious amounts of cobalt into the interface. Higher temperatures and longer carburizing times tend to increase the diffusion and thickness of the interface. Preferably, the substrate is at a temperature of from 900 to 1200 degrees centrigrade and more preferably from 1000 to 1100 degrees centigrade.

The carburizing treatment should be continued for a sufficient period of time to permit diffusion of the carbon through the coating and into the interface region of the substrate. For titanium carbide coating having a thickness on the order of about 5 to about 15 microns, typical carburizing times vary from 10 to 60 minutes. To achieve substantially complete decomposition of the eta phase, inserts having lower magnetic saturation values require longer time for carburizing than inserts having higher magnetic saturation values. The magnetic saturation value is an indication of carbon deficiency. Lower magnetic saturation values indicate higher carbon deficiency. More carbon deficient substrates require longer carburization times. At magnetic saturation values in the range of 125 to 145, carburization times on the order of 30 to 60 minutes are sufficient. Higher magnetic saturation values require less time with times reduced to 10 to 30 minutes with magnetic saturation values over 145.

EXAMPLE 1

Cemented carbide inserts are loaded into the furnace. The furnace is then purged with a gaseous mixture comprising 75% hydrogen and 25% by weight nitrogen as the furnace is heated to the operating temperature. When the operating temperature of 1050° C. is reached, the gas flow is maintained for 15 minutes and then adjusted for the deposition reaction. The gaseous mixture for deposition contains 26.4% by volume hydrogen, 1.2% by volume methane, 1.5% by volume TiCl4, 70.7% by volume argon, and 0.24% by volume HCl. The gaseous ingredients are first metered into a premixing chamber which is maintained at a temperature of 900° C. The mixed gases then flow into the reaction zone. The coating process is carried out for 120 minutes, and TiC coating having a thickness from approximately 4 to approximately 6 microns is deposited. The eta phase which is present as a discontinuous layer has a thickness at the interface up to 1.5 microns. The insert as prepared in the above manner is carburized by heating the furnace to a temperature of 1150 degrees centigrade, and introducing a hydrogen and methane gaseous mixture into the reaction chamber. The mixture contains about 0.75 volume percent methane. The carburizing treatment is carried out for about 30 minutes. After the above treatment, the insert is examined. The surface has a crystallite size of the coating from approximately 0.1 to approximately 0.3 micron, and the ratio of x-ray intensities of the (200) to (111) crystallographic planes is greater than about 7.0. There is no sign of the eta phase which was previously present.

The Titanium carbide coated substrate body produced by the methods of the examples given above may be coated with additional layers of refractory material by chemical vapor deposition techniques or physical vapor deposition techniques known in the art. For example, the preferred intermediate coatings of titanium nitride, titanium carbonitride, hafnium nitride, hafnium carbide or hafnium carbonitride and alumina, or even additional layers of titanium carbide are applied by chemical vapor deposition. Other refractory materials are applied by chemical vapor deposition techniques where such techniques are applicable, or by physical vapor deposition techniques such as direct evaporation, sputtering, etc.

Useful characteristics of the chemical vapor deposition method are the purity of the deposited layer and the tendency for some diffusional interaction between the layer being deposited and the substrate during early stages of the deposition process which leads to good layer adherently.

As an example, titanium nitride intermediate coating layers and outer coating layers are formed on the titanium carbide coated substrate or on the intermediate coating layers of cutting tools of this invention by passing a gaseous mixture of titanium tetrachloride, a gaseous nitrogen source such as nitrogen or ammonia, and hydrogen over the substrate at a temperature of between about 800° C. and 1500° C., preferably at temperatures above about 1000° C. The reaction is described by the following equation; hydrogen is added to insure that the reaction takes place in a reducing environment;

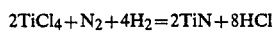

$$2TiCl_4 + N_2 + 4H_2 = 2TiN + 8HCl$$

As another example, titanium carbide intermediate coating layers or outer coating layers are formed on the titanium carbide coated substrates or on the intermediate coating layers of cutting tools of this invention by passing a gaseous mixture of titanium tetrachloride, a gaseous carbon source such as methane, and hydrogen over the substrate at a temperature of between about 800° C. and 1500° C., preferably at temperatures above about 1000° C. The reaction is described by the following equation, although hydrogen is often added to insure that the reaction takes place in a reducing environment:

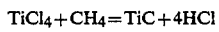

$$TiCl_4 + CH_4 = TiC + 4HCl$$

As another example, titanium carbonitride intermediate coating layers or outer coating layers are formed on the titanium carbide coated substrate or intermediate coating layers of cutting tools of this invention by the chemical vapor deposition technique of passing a gaseous mixture of titanium tetrachloride, a gaseous carbon source such as methane, a gaseous nitrogen source such as nitrogen or ammonia, and hydrogen over the substrate at a temperature of between about 800° C. and 1500° C. preferably at temperatures above about 1200°

C. Dissociated ammonia may be substituted for a mixture of nitrogen and hydrogen gases. The reaction is described by the following equation, although hydrogen is often added to insure that the reaction takes place in a reducing environment:

$$TiCl_4 + CH_4 + N_2 = Ti(C_xN_y) + 4HCl$$

The mixture is passed over the heated substrate until the desired coating thickness is achieved. Routine experimentation is used to determine the rate of coating thickness growth at a particular gaseous flow rate and temperature.

Control of the amounts of methane and nitrogen in the gas mixture permit the formation of layers in which the ratio of x to y in the formula $(Ti(C_xN_y)$ are varied. The preferred values of x and y range between about 0.5 to about 0.6 for x and from about 0.4 to about 0.5 for y resulting in a preferred range of x/y ratio of from about 1.0 to about 1.5. The most preferred ratio of x to y is about 1.22, corresponding to values for x and y of about 0.55 and about 0.45, respectively.

As another example, alumina intermediate coating layers or outer coating layers are formed on the titanium carbide coated substrate or intermediate coating layers of the cutting tools of this invention by chemical vapor deposition techniques or physical vapor deposition techniques or physical vapor deposition techniques known in the art. In one chemical vapor deposition technique, more fully described in U.S. Pat. No. 3,914,473, vaporized aluminum chloride or other halide of aluminum is passed over the heated coated substrate together with water vapor and hydrogen gas. Alternatively, the aluminum oxide is deposited by physical vapor deposition techniques such as direct evaporation or sputtering. The reaction for the chemical vapor deposition technique is described by the following equation, although hydrogen has is often added to insure that the reaction takes place in a reducing atmosphere:

$$2AlCl_3 + 3H_2O = Al_2O_3 + 6HCl$$

The substrate or coated substrate piece or pieces are heated to a temperature between about 800° C. to about 1500° C. in a furnace equipped for gaseous flow. The aluminum chloride supply is preheated to vaporize the material, and the aluminum chloride vapor is passed through the furnace, together with the other gases. The gas mixture is passed over the heated substrate or coated substrate until the desired coating thickness is achieved. Routine experimentation is used to determine the rate of coating thickness growth at a particular gaseous flow rate and temperature.

In another, preferred method of coating the titanium carbide coated substrate bodies or the intermediate coatings with one or more adherent alumina coating layers, aluminum chloride is reacted with carbon dioxide in the presence of hydrogen gas according to the following equation:

$$2AlCl_3 + 3CO_2 + 3H_2 = Al_2O_3 + 3CO + 6H$$

carbon monoxide is optionally added to the gas mixture passed over the heated substrate or coated substrate bodies in order to establish the desired equilibrium gas composition.

Depending on the machining application and the work piece material, the combination of various coatings as described above can be tailored to enhance the overall tool performance. This is achieved through the combinations which lead to improved adherence of the coatings to substrate and the coatings to coatings, and achieved by the improved structure/property of the coatings such as hardness, fracture toughness, impact resistance, chemical inertness, etc.

While there have been shown and described what are at present considered to be the preferred embodiments of the present invention, it will be appreciated that various changes and modifications may be made therein without departures from the spiral and scope of the invention as described in the appended claims.

EXAMPLE 2

The deposition of TiC is carried out as described in Example 1, except no HCl gas is added to the gas mixture. The ratio of X-ray intensities of TiC crystallographic planes (200) to (111) is about 1.7. The carburizing treatment is carried out as described in Example 1. Again, there is no evidence of eta phase which was previously present.

We claim:

1. A process for forming a coated cemented carbide cutting insert, said cemented carbide being the type comprising more than 70 percent by weight tungsten carbide and a matrix binder comprising cobalt wherein said process comprises chemically vapor depositing a layer of titanium carbide on said cemented carbide substrate by heating gaseous reactants comprising titanium chloride, a suitable hydrocarbon gas, and an inert component under suitable conditions to form a titanium carbide coated insert having an eta phase in the cemented carbide substrate adjacent said titanium carbide coating, said eta phase comprising chemical compounds consisting essentially of cobalt, tungsten and carbon, and contacting said titanium carbide surface with a carburizing gas for a sufficient time and at a sufficient temperature to convert substantially all of said eta phase to elemental cobalt and tungsten carbide.

2. A process for forming a coated cemented carbide cutting insert according to claim 1 wherein the thickness of said titanium carbide coating is from about 2 microns to about 8 microns.

3. A process for forming a coated cemented carbide cutting insert according to claim 2 wherein said deposition reaction proceeds according to the following formula:

$$TiCl_4 + CH_4 = TiC + 4HCl$$

4. A process for forming a coated cemented carbide cutting insert according to claim 3 wherein said carburizing gas comprises a component having the formula $C_nH_{2n+2}$ wherein n is from 1 to 4.

5. A process for forming a coated cemented carbide according to claim 4 wherein the concentration of said carburizing gas is maintained at a sufficiently high concentration to permit sufficient carbon to be available to diffuse through said coating.

6. A process for forming a coated cemented carbide according to claim 5 wherein said carburizing gas includes an inert component, said inert component comprising hydrogen.

7. A process for forming a coated cemented carbide according to claim 6 wherein said carburizing gas is methane.

* * * * *